United States Patent
Wang et al.

(10) Patent No.: US 8,359,554 B2
(45) Date of Patent: *Jan. 22, 2013

(54) VERIFICATION OF 3D INTEGRATED CIRCUITS

(75) Inventors: Chung-Hsing Wang, Baoshan Township, Hsinchu County (TW); Chih Sheng Tsai, Houli Shiang (TW); Ying-Lin Liu, Hsinchu (TW); Kai-Yun Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/274,091

(22) Filed: Oct. 14, 2011

(65) Prior Publication Data

US 2012/0036489 A1    Feb. 9, 2012

Related U.S. Application Data

(62) Division of application No. 12/141,690, filed on Jun. 18, 2008, now Pat. No. 8,060,843.

(51) Int. Cl.
*G06F 17/50* (2006.01)

(52) U.S. Cl. ............ 716/52; 716/55; 716/100; 716/106; 716/111; 716/137

(58) Field of Classification Search ............... 716/50–56, 716/100, 106–112, 119, 137
See application file for complete search history.

(56) References Cited

U.S. PATENT DOCUMENTS

| | | |
|---|---|---|
| 6,260,177 B1 * | 7/2001 | Lee et al. ............... 716/121 |
| 6,415,421 B2 | 7/2002 | Anderson et al. |
| 6,925,614 B2 | 8/2005 | Lu et al. |
| 7,073,154 B1 * | 7/2006 | Garrison et al. ............ 326/41 |
| 2003/0084418 A1 * | 5/2003 | Regan ............... 716/14 |
| 2003/0229875 A1 * | 12/2003 | Smith et al. ............ 716/10 |
| 2003/0237069 A1 | 12/2003 | Mohan et al. |
| 2004/0117748 A1 * | 6/2004 | Tester ............... 716/11 |
| 2005/0144578 A1 * | 6/2005 | Decloedt ............... 716/5 |
| 2005/0251771 A1 * | 11/2005 | Robles ............... 716/5 |
| 2005/0280438 A1 * | 12/2005 | Park ............... 326/41 |
| 2006/0225017 A1 * | 10/2006 | Uchida ............... 716/12 |
| 2007/0096094 A1 * | 5/2007 | Levinski et al. ............ 257/48 |
| 2008/0072182 A1 * | 3/2008 | He et al. ............... 716/2 |
| 2008/0120586 A1 * | 5/2008 | Hoerold ............... 716/9 |
| 2008/0163139 A1 * | 7/2008 | Scheffer et al. ............ 716/4 |
| 2009/0077518 A1 * | 3/2009 | Beckenbaugh et al. ........ 716/11 |
| 2009/0302461 A1 * | 12/2009 | Winter et al. ............... 257/713 |
| 2010/0005442 A1 * | 1/2010 | Ghinovker et al. ............ 716/21 |

OTHER PUBLICATIONS

Singapore Office Action Dated Jun. 30, 2011; Application No. PIIE080275, 4 pages.

Chistinel Ababei et al; "Placement and Routing in 3D Integrated Circuits;" 10 Pages; Research Supported by DARPA Under Grant N66001-04-1-8909.

* cited by examiner

*Primary Examiner* — Paul Dinh
(74) *Attorney, Agent, or Firm* — Haynes and Boone, LLP (57) ABSTRACT

A method of designing and verifying 3D integrated circuits (3D IC) including providing a first layout corresponding to a first device of a 3D IC. The first layout includes a first interface layer. A second layout corresponding to a second device of the 3D IC is also provided. The second layout includes a second interface layer. A verification of the 3D is performed by verifying the first and second interface layers. The verification includes performing at least one of a design rule check (DRC) or a layout-versus-schematic (LVS) on the first and/or second interface layers.

20 Claims, 10 Drawing Sheets

VERIFICATION OF 3D INTEGRATED CIRCUITS

CROSS REFERENCE TO RELATED APPLICATION

The present application is a divisional of U.S. Utility application Ser. No. 12/141,690 filed on Jun. 18, 2008, now U.S. Pat. No. 8,060,843, the entire disclosure of which is incorporated herein by reference.

BACKGROUND

The present disclosure related generally to the physical design and verification of three-dimensional (3D) integrated circuits.

A 3D integrated circuit (3D IC) includes a semiconductor a device with two or more layers of active electronic components integrated (e.g., vertically stacked and connected) to form an integrated circuit. Various forms of 3D IC technology are currently being developed including die-on-die stacking, die-on-wafer stacking, and wafer-on-wafer stacking. In 3D IC technology electronic components (e.g., integrated circuits) are built on two or more substrates and packaged to form a single integrated circuit. The electronic components are aligned and bonded together, either after dicing into singulated die or while in wafer form (which may then be subsequently diced). Vertical connections are made between the electronic components such as through the use of through-silicon vias (TSVs). The stacked die may be then packaged such that I/Os can provide connection to the 3D IC.

3D IC technology is desirable in that it allows greater functionality to be provided in a smaller footprint and with increased speed (for example, a shorter vertical connections may provide for decreased delay). However, 3D IC technology also includes challenges. Each electronic component or device (e.g., die) itself includes complicated design features. The interaction of the stacked die create even greater design challenges, which have not yet been addressed by designers, including CAD tool developers. Both the physical connections and the electrical connections between stacked devices must be made accurately and robustly made. An improved method of connection, and verification of such a connection is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that specific embodiments are provided herein as examples to teach the broader inventive concept, and one of ordinary skill in the art can easily apply the teaching of the present disclosure to other methods or systems. In addition, it is understood that the methods and systems discussed in the present disclosure include some conventional structures and/or processes. Since these structures and processes are well known in the art, they will only be discussed in a general level of detail. Reference numbers may be repeated throughout the drawings for sake of convenience and example, and such repetition does not indicate any required combination of features or steps throughout the drawings. Furthermore, though described herein a being applicable to 3D IC design and verification methods, one skilled in the art would recognize other design processes that may benefit from the disclosure. Verification methods applicable to 3D ICs including layout-versus-schematic (LVS) and design rule checks (DRC) are described in detail here, however, other design processes are within the scope of the disclosure such as, optical proximity correction (OPC) methods.

Figure 1:
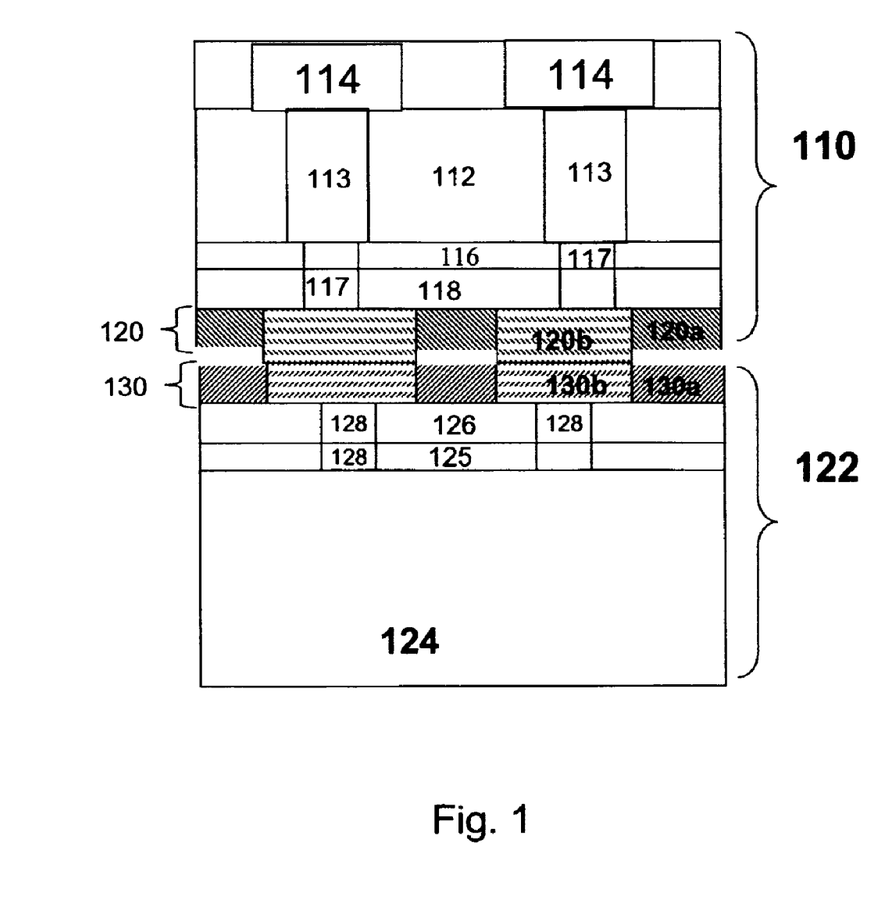
FIG. 1 is a cross-sectional view illustrating an embodiment of 3D IC.

Referring to FIG. 1, a 3D integrated circuit (3D IC) 100 is illustrated. The 3D IC 100 includes two devices, a top die 110 and a bottom die 120. Though referred to herein as top and bottom die, the descriptive terms are merely relative and provide no indication of any absolute orientation of the devices. Other terms are also used for ease of description and to delineate the plurality of devices (e.g., die) included in a 3D IC such as, first tier device and second tier device. Again, these terms provide no absolute arrangement of devices, but are used simply to distinguish between devices of a 3D IC. For example, the devices (e.g., die) arrangement may be vertical, horizontal, or a combination thereof. One or more devices of a 3D IC may be formed on a separate and distinct substrate, and then coupled, physically and electrically, with other devices of the 3D IC and subsequently packaged to form a single 3D IC device.

The top die 110 includes a substrate 112. The substrate 112 may include a semiconductor substrate (e.g., a wafer) and include active and/or isolation regions providing device features (e.g., transistors). The regions and features may be formed using a plurality of conductive, insulating, and/or semiconductor layers. Through-silicon-vias (TSV) 113 are provided through the substrate 112 such that a bond pad 114 may be operably coupled to the TSV 113. The bond pad 114 may be provided on a bonding layer. The bond pad 114 includes an I/O pad providing connection to the 3D IC 100 including and electrical connection to the die 110 and the die 122. A layer of dielectric 116 (e.g., interlayer dielectric ILD) may be formed on the substrate 112. In an embodiment, the dielectric layer 116 includes phosphosilicate glass (PSG). On the layer of dielectric 116, one or more interconnect layers 118 may be formed. The interconnect layers 118 include conductive lines (e.g., traces or routing), vias, and/or interposing interlayer dielectrics (ILD). The interconnect layers 118 are coupled to the active devices of the substrate 112. The interconnect layers 118 are typically referred to in the art as "metal layers," (e.g., metal 1, metal 2). However, any conductive material may provide the interconnections. Vias 117 also provide an electrical connection to the active devices of the substrate 112. An interface layer 120 is formed on the interconnect layers 118. The interface layer 120 includes the layer nearest the bottom die 122. A portion of the interface layer 120 may be directly coupled another device (e.g., the bottom die 122) of the 3D IC. The interface layer 120 includes a dielectric region 120*a* and a conductive bonding area 120*b*. The dielectric region 120*a* may be recessed from the conductive bonding area 120*b*. In an embodiment, the conductive bonding area 120*b* includes copper (e.g., a copper pad). The interface layer 120 may also be referred to as the "top metal" layer. In an embodiment, the interface layer 120 is the top (e.g., upper most) interconnect layer, such as described above with reference to the interconnect layers 118. The interface layer 120 may include dielectric regions, conductive traces, conductive pads including probe pads and bonding pads operable to provide connection to another die.

The bottom die 122 includes a substrate 124. The substrate 124 may include a semiconductor substrate (e.g., a wafer) and include active and/or isolation regions forming device features (e.g., transistors) and may be substantially similar to the substrate 112. A dielectric layer 125 (e.g., ILD) is formed on the substrate 124 and may be substantially similar to the layer 116. On the dielectric layer 125, one or more interconnect layers 126 are formed. The interconnect layers 126 may include conductive lines (e.g., traces or routing), vias, and interposing dielectric layers (e.g., interlayer dielectric ILD). The interconnect layers 126 may be substantially similar to the interconnect layers 118. Similar to as described above, the interconnect layers 126 are typically referred to as "metal layers" and provide a path for connection to active devices on the substrate 124. Vias 128, which may be substantially similar to the vias 117, also provide an electrical connection to the active devices of the substrate 124. An interface layer 130 is formed on the substrate 124. The interface layer 130 includes the layer nearest the top die 110. A portion of the interface layer 130 may be directly coupled another device (e.g., the top die 110) of the 3D IC, and in particular to the interface layer of another device (e.g., the interface layer 120). The interface layer 130 includes a dielectric region 130*a* and a conductive bonding area 130*b*. The dielectric region 130*a* may be recessed from the conductive bonding area 130*b*. In an embodiment, the conductive bonding area 130*b* includes copper (e.g., a copper pad). The interface layer 130 may also be referred to as the "top metal" layer. In an embodiment, the interface layer 130 is the top (e.g., upper most) interconnect layer included in the interconnect layers 126. The interface layer 130 may include dielectric regions, conductive traces (e.g, interconnects), conductive pads including probe pads and bonding pads operable to provide connection to another device. The 3D IC 100 is exemplary only and not intended to be limiting in any manner, additional layers may be present and/or omitted.

The 3D IC 100 may be represented by a physical design layout ("layout"). The layout may include definition of active features (e.g., transistors including gates, doped regions), isolation regions, interconnect structures (including conductive lines, vias and contacts), and/or other physical elements that will be formed on a substrate. The layout typically includes a plurality of "layers" that correspond to each of a plurality of "layers" to be fabricated on a substrate (e.g., a semiconductor wafer) to form an integrated circuit. The term layer as provided herein may be used to represent a layer in the layout, and/or the corresponding layer in the device as fabricated. A typical format for the layout is a GDS II file, however other formats are possible.

Figure 2:
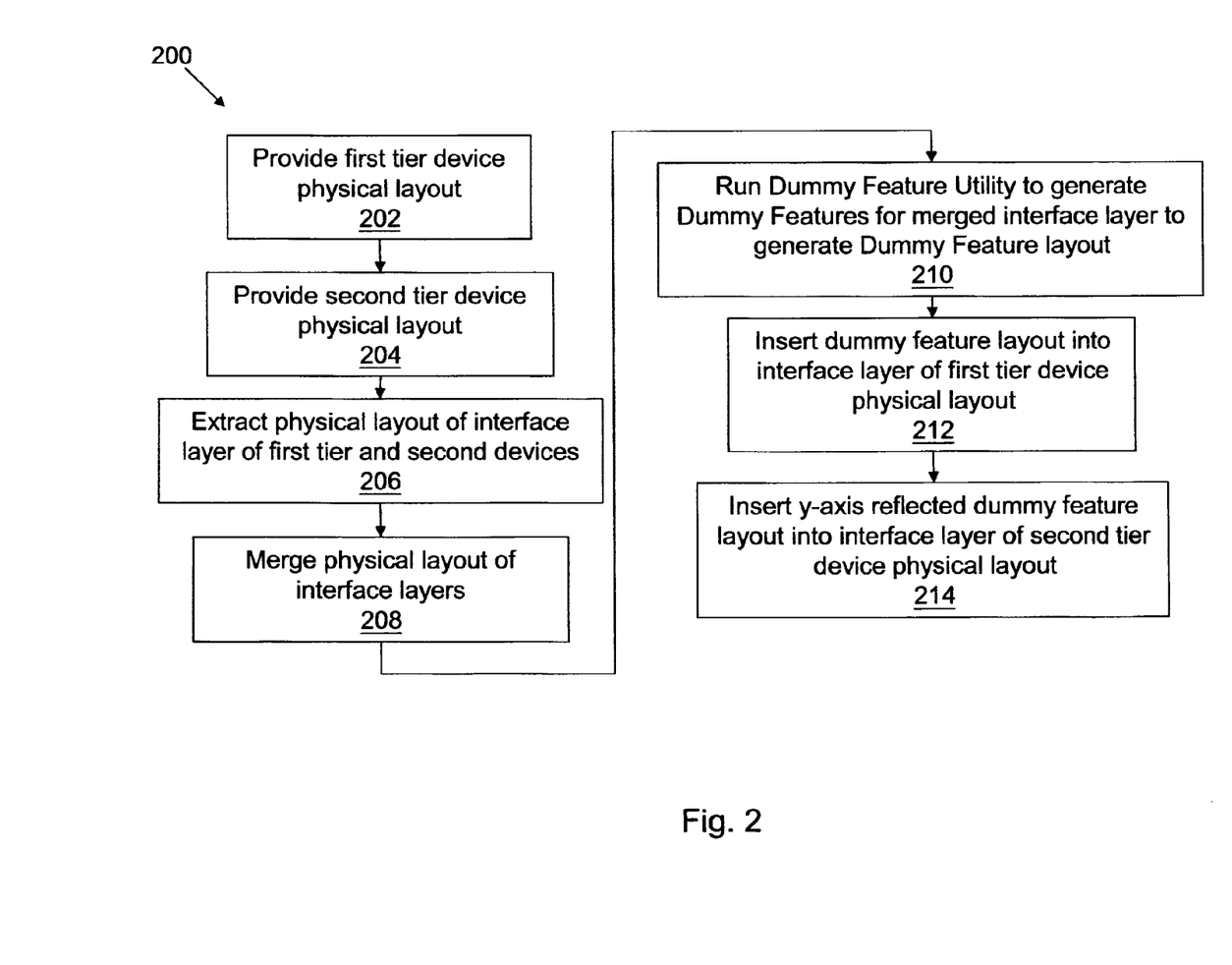
FIG. 2 is a flowchart illustrating an embodiment of a method of providing a dummy feature pattern for a 3D IC.
Figure 3:
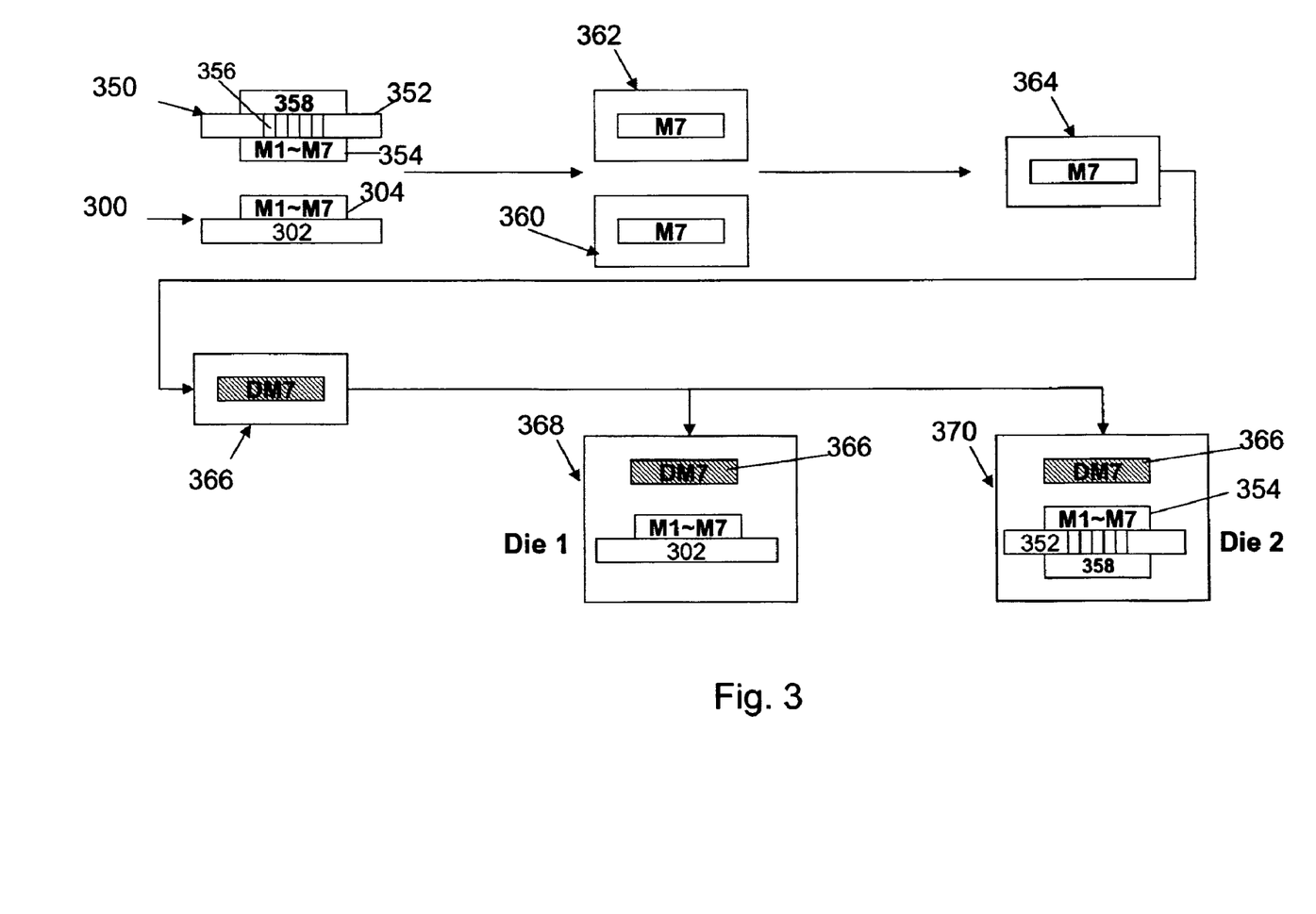
FIG. 3 is a block diagram illustrating an embodiment of the method of FIG. 2.

Referring now to FIGS. 2 and 3, illustrated is a flow chart of a method 200 of providing a dummy feature pattern for a 3D IC. FIG. 3 illustrates a corresponding block diagram illustrating the steps of the method 200. A dummy feature pattern may include one or more dummy features (e.g., structures) including features that are not electrically connected to an active device. The method 200 begins at step 202 where a physical layout design is provided for a first tier device. The first tier device is designed to be included in a 3D IC. The physical layout design may include any design file format known in the art such as, a GDS II file. The physical layout design includes the layout of one or more layers of the first tier device and in particular includes an interface layer (e.g., layout of an interface layer/top metal) of the first tier device. FIG. 3 illustrates a first tier device 300 including a substrate 302 and a plurality of metal layers 304 (illustrated M1-M7). Note that the top metal layer is illustrated as M7, however any number of interconnect layers are possible. In the illustrated embodiment, M7 provides the interface layer of the first tier device. The interface layer may include the layer of the first tier device that will provide coupling (physical and electrical) to a second tier device.

The method 200 then proceeds to step 204 where a physical layout design is provided for a second tier device. The second tier device is designed for inclusion in a 3D IC with the first tier device. The physical layout design may include a design file format known in the art such as, a GDS II file and include one or more layers of the second tier device. The physical layout in particular includes the layout of the interface layer (e.g., top metal) of the second tier device. The first and second tier devices may be substantially similar to the top die 110 and the bottom die 122, described above with reference to FIG. 1. The layout design files (e.g., GDS II files) of the first and second tier devices may be separate and distinct files. FIG. 3 illustrates a second tier IC 350 including a substrate 352 and a plurality of metal layers 354. The top metal layer is noted as M7, however any number of interconnect layers are possible. In the illustrated embodiment M7 provides the interface layer of the second tier device. The second tier device also includes TSV 356 and a bonding layer 358. In an embodiment, the bonding layer 358 includes a plurality of bond pads to provide connections to the 3D IC including second tier IC 350 and first tier IC 300.

The method 200 then proceeds to step 206 where a physical design layout (e.g., a layout file such as in a GDS II format) of the interface layers of the first and second tier devices are extracted. In an embodiment, a layout design file including only the interface layer of the first tier device is generated, and a second layout design file including only the interface layer of the second tier device is generated. FIG. 3 illustrates a design file 362 providing a second tier device interface layer layout and a design file 360 providing a first tier device interface layer layout. The method 200 then proceeds to step 208 where the layout designs of the interface layers are merged to form a layout file. In an embodiment, a single physical layout design (e.g., having a format of single GDS II file) including the layout of the interface layers of the first and second devices is formed. The layout may provide a single layer including the structures from the first tier device interface layer and the second tier device interface layer. Merging includes taking two distinct layout files (e.g., two distinct files representing at least two distinct layers) and combining them together to form a single layout file. The single layout file may include a single layer that illustrates the combination of structures that were previously represented in two layouts, for example, each layout of a distinct layer. One file may be reflected on an axis (e.g., y-axis) such that the layouts are properly aligned when merged (e.g., to account for the orientation of the die when provided in a 3D IC). FIG. 3 illustrates a merged design file 364 representative of the merged interface layer (M7) which includes the layouts of both design files 360 and 362. The merged design file 364 may provide a layout of a single layer. In an embodiment, design file 362 is reflected on its y-axis before merging to form merged design file 364. Reflecting about the y-axis accounts for the alignment of the layouts when die 350 is "flipped" and positioned on die 300 in a 3D IC.

The method 200 then proceeds to step 210 where a dummy feature utility is ran on the merged file. Any dummy feature utility known in the art may be used, and may generate and/or place one or more dummy feature patterns in the layout. The utility may include rule-based and/or model-based components. The dummy feature pattern may be placed in the portions of the layout including no structure in the interface layer of either the first or second tier devices. The dummy feature utility generates a physical layout design for dummy features. The layout for the dummy features may be provided as a separate design file (e.g., GDS II file). FIG. 3 illustrates the generation of layout design file 366 (DM7) including the dummy feature layout provided by running a dummy feature utility on the merged design file 364.

The method 200 then proceeds to steps 212 and 214 were the dummy feature pattern layout is included in the first tier device layout and the second tier device layout respectively. In step 212, the dummy feature pattern layout is included in the interface layer of the first tier device layout. FIG. 3 illustrates the insertion of dummy feature pattern layout 366 (DM7) into the design of the first tier device 350 to provide first tier device layout 368. In step 214, the dummy feature pattern layout is included in the interface layer of the second tier device layout. The dummy feature pattern layout may first be reflected upon its y-axis and then inserted into the second tier device layout (e.g., the mirror image of the dummy feature pattern layout is provided to the second tier device layout). The reflection may, for example, ensure proper alignment when the second tier device is "flipped" and positioned on (e.g, stacked on) the first tier device in the 3D IC device. In an embodiment, one or more of the dummy feature patterns added will be symmetric between the first tier device and the second tier device. In an embodiment, the entire dummy feature pattern added is symmetric between the first tier device and the second tier device. The dummy feature patterns of the first and second tier device may be symmetric with respect to an x-axis and/or a y-axis. FIG. 3 illustrates the insertion of dummy feature pattern layout 366 (DM7) into the design of the second tier device 350 to provide the second tier device layout 370. In an embodiment, the device layouts 368 and 370 are GDS II files. The dummy feature pattern layout 366 (DM7) may be added to the device layouts 368 and 370 such that when formed in a 3D IC, the dummy feature pattern on the device associated with layout 368 will be symmetric to the dummy feature pattern on the device associated with layout 370.

The method 200 may be beneficial in that dummy features are added to both the first and second tier devices taking into account the layout of the other device. For example, dummy feature pattern to be included on the first tier device is generated based on the presence of device structures (e.g., interconnect traces, contacts, pads, etc) on both the first tier device and the second tier device. In other words, dummy structures may be added to the interface layer only where there is open space in both the first tier and second tier devices. This may prevent a short caused by placement of dummy features in a location on one device that may come into contact with an device structure (e.g., interconnect line) of the opposing device when the 3D IC is fabricated. For example, placement of a dummy feature pattern on a first device interface layer that will be coupled to a device structure on the interface layer of a second device.

Figure 4:
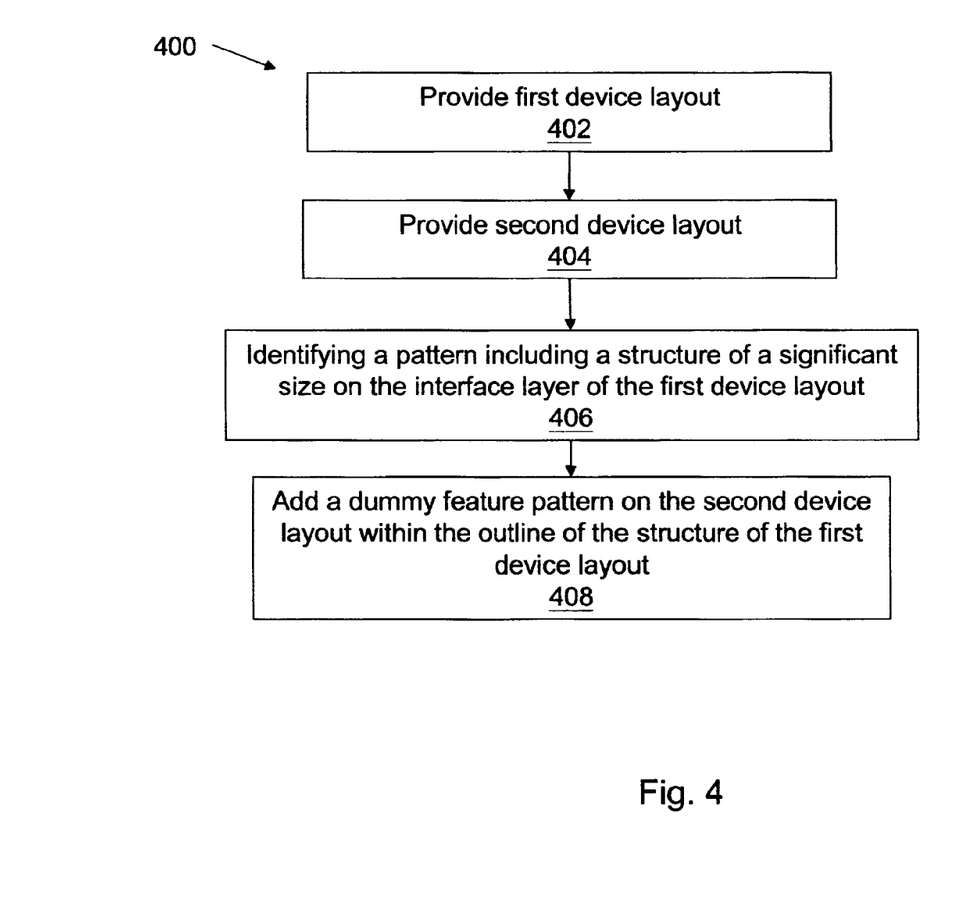
FIG. 4 is a flowchart illustrating an embodiment of a method providing a dummy feature pattern for a device of a 3D IC.

Referring now to FIG. 4, illustrated is a method 400 for insertion of dummy feature patterns into one or more devices of a 3D IC. The method 400 may be referred to herein as the incremental addition of dummy feature patterns. In an embodiment, the method 400 is performed in addition to the method 300 described above to provide a dummy feature pattern for a 3D IC. The method 400 includes adding a dummy feature pattern on a device of a multiple device IC (e.g., a 3D IC) based on the layout of another device included in the multiple device IC. For example, the method 400 may determine a dummy feature pattern for the interface layer of a second device based on the interface layer layout of a first device of a 3D IC. The method 400 begins with steps 402 and 404 where a physical layout design for a first and second device, respectively are provided. The first and second devices may be configured for inclusion in a 3D IC device (e.g., designed for fabrication and assembly such that a 3D IC device is formed including at least the first device and the second device). The method 400 then proceeds to step 406 where a pattern including a structure of a significant size on the interface layer of the first device layout is identified. In an embodiment, the structure identified includes a probe pad. The significant size may be determined based on the metal density requirements of the process. The method 400 then proceeds to step 408 where a dummy feature pattern is included in the second device layout in an area that corresponds with (e.g., aligns with, such as vertically aligns, when assembled in a 3D IC). The corresponding area into which a dummy feature pattern is provided may be symmetric to the probe pad.

For example, in an embodiment, a 3D IC includes a first device and a second device. A dummy feature pattern may be added into the second device to an area defined by a structure (e.g., a probe pad) on the first device layout. To determine this pattern, the layout of the first device is obtained and a dummy feature pattern placed within the boundaries of a structure, for example, a dummy feature pattern may be placed within a probe pad area on the first device. This generates a dummy feature pattern layout. The dummy feature pattern layout is then extracted from the first device layout, reflected about its y-axis (if needed), and inserted into the second device layout pattern. The reflection about its y-axis allows the dummy feature pattern to be placed at a location on the second device that aligns with the probe pad on the first device (e.g., the dummy feature pattern would be located on the second device at a position directly above/below the probe pad location on the first device when provided in a 3D IC.)

This method may improve the density of an otherwise lower density area on a device (e.g., a second die) of a 3D IC device. For example, using the method of 300, if a large probe pad is found on a first device, then no dummy feature pattern will be added in that area in the merged design file (e.g., in step 210 described above). Therefore, when the dummy feature pattern layout is extracted and inserted into the second die, a large vacant area (e.g., of the probe pad outline), may be located on the second device. This low density area can provide issues, for example, in the fabrication of photomasks and devices.

Figure 5:
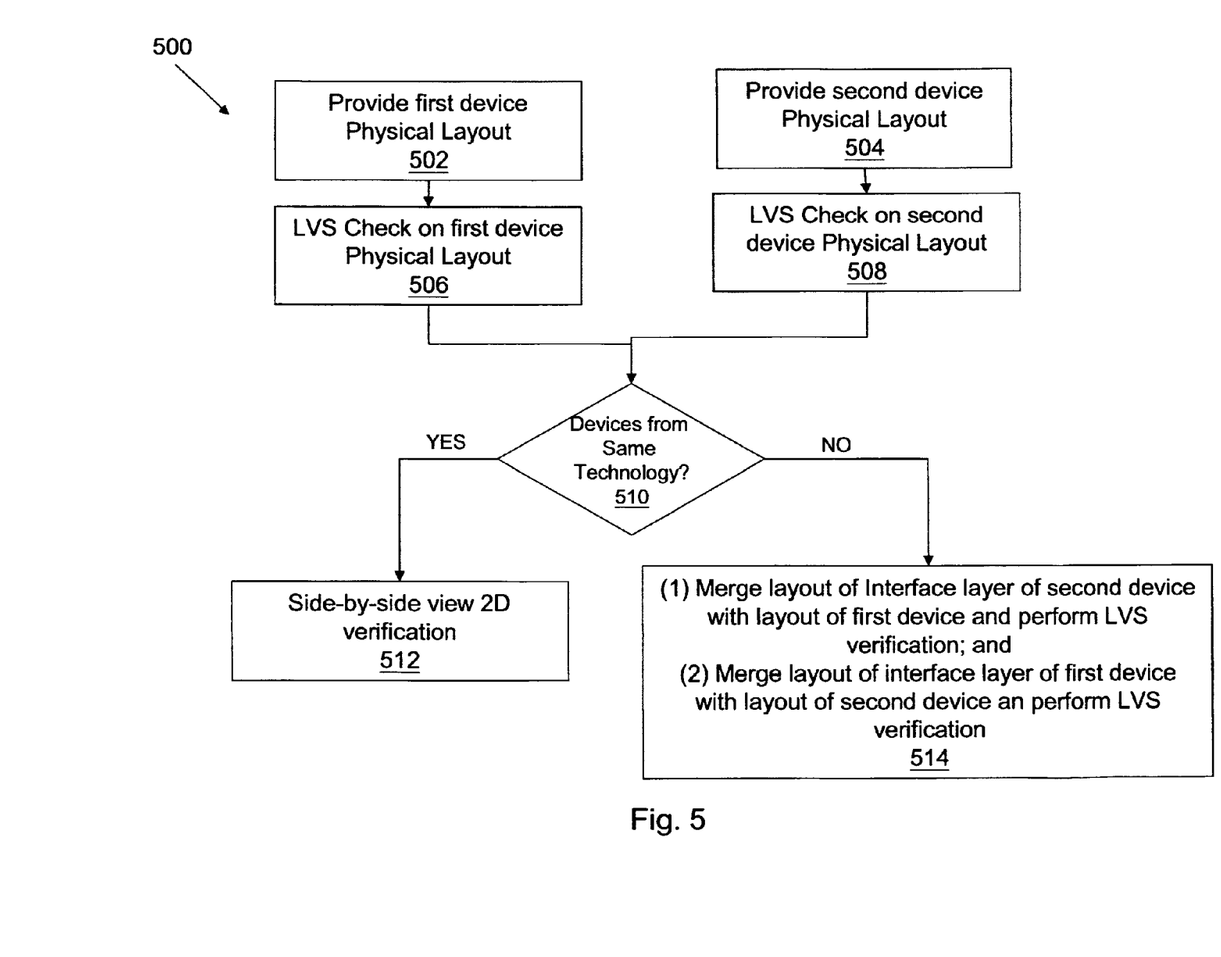
FIG. 5 is a flowchart illustrating an embodiment of a method of design verification of a 3D IC.

Referring now to FIG. 5, illustrated is a method 500 of verification of a 3D IC design or portion thereof. The embodiment illustrates includes a design verification including a layout-versus-schematic (LVS) verification; however, other embodiments may be possible and within the scope of this disclosure. The method 500 begins at steps 502 and 504 where a physical layout design (a layout) of a first device and a layout of a second device are provided, respectively. The first and second devices are designed for inclusion in a 3D IC. The first and second devices may be substantially similar to the die 110 and/or 120, described above with reference to FIG. 1. Each respective physical layout design includes an interface layer (e.g., a layout of the interface layer) of the device. The physical layout design may be provided in a GDS II format, or other layout format known in the art.

The method 500 then proceeds to steps 506 and 508 where an LVS verification is separately performed on each physical layout (i.e., the first and second layout). An LVS verification includes determining that the manipulation of the design from a netlist form to the physical layout (e.g., a GDS II file) form was properly executed.

Figure 6:
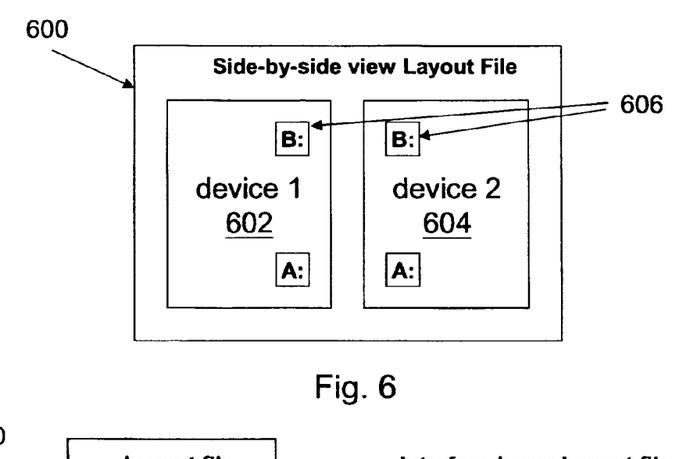
FIGS. 6 and 7 are top-views illustrating embodiments of a design files used with the method of FIG. 5.

The method 500 then proceeds to decision block 510 where it is determined if the first and second devices are associated with the same technology. The decision block includes, for example, a determination of the technology node (e.g., 65 nm, 90 nm) with which the devices are associated. In an embodiment, at decision block 510 it is determined that the first and second devices are associated with the same, or substantially similar technology (e.g., the layers match). The method 500 then proceeds to step 512 where a verification including a side-by-side view (e.g, 2D view) for LVS connectivity is performed. The verification may provide for checking the logic and physical connectivity of the physical layout design files (e.g., GDS II files) of the first and second devices. The side-by-side view (2D) may emulate the 3D IC layout. The verification may be performed with the virtual connectivity feature of the LVS verification tool operable (e.g., providing for connection of the bonds between the first and second devices such as illustrated by conductive bonding area 120b and 130b, described above with reference to FIG. 1). The virtual connect feature may provide for connection of the interface layers of the die. Internal pin text may also be provided. FIG. 6 illustrates a physical layout 600 including the side-by-side view of first device layout 602 and second device layout 604. Pin text 606 is also illustrated. The layout 600 may include a plurality of layers of the first and second devices. In an embodiment, the layout 600 is a GDS II format. The layout 600 may be a single GDS II file. An LVS verification may be run on the layout 600 according step 512 of the method 500.

Figure 7:
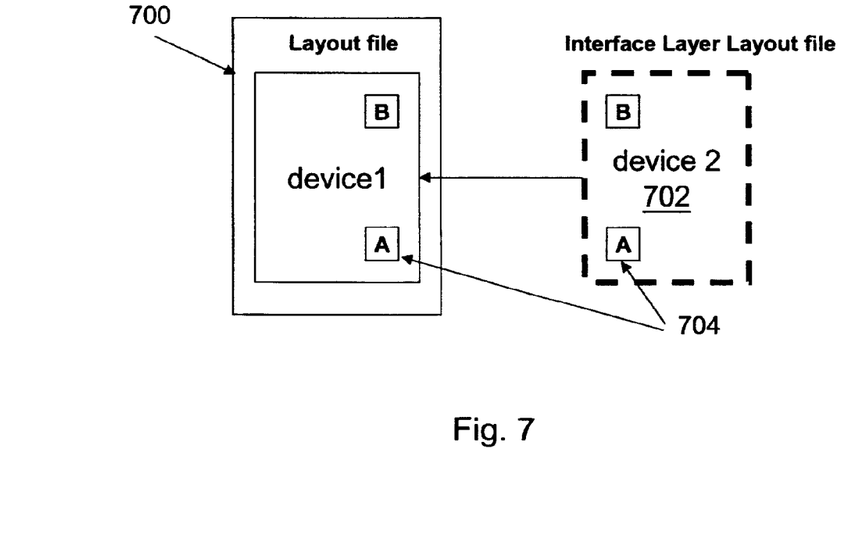

In an embodiment, at decision block 510 it is determined that the first and second devices are associated with a different technology. The method 500 then proceeds to step 514 where a plurality of verification procedures are performed. The layout of the interface layer of the first device is merged into the layout of the second device. The LVS verification is ran. A second verification is then performed. The layout of the interface layer of the second device is merged into the layout of the first device. The second verification—an LVS verification—is ran. Pin text may be included in layouts to provide the appropriate connections between the interface layers. In an embodiment, the virtual connectivity feature of the LVS verification tool is not used. In an embodiment, only the interface layers (e.g., their connectivity to one another) are verified in step 514. FIG. 7 illustrates a layout 700 of a first device. The layout 700 may include all the layers of the device. A layout 702 including only the interface layer of a second device is reflected about its y-axis (to simulate the positioning as stacked in a 3D IC), and merged with the physical design layout file 700. Pin text 704 is illustrated. In an embodiment the layout 700 and interface layer layout 702 are in GDS II format. An LVS verification may then be run on the layout 700 including merged layout 702.

Figure 8:
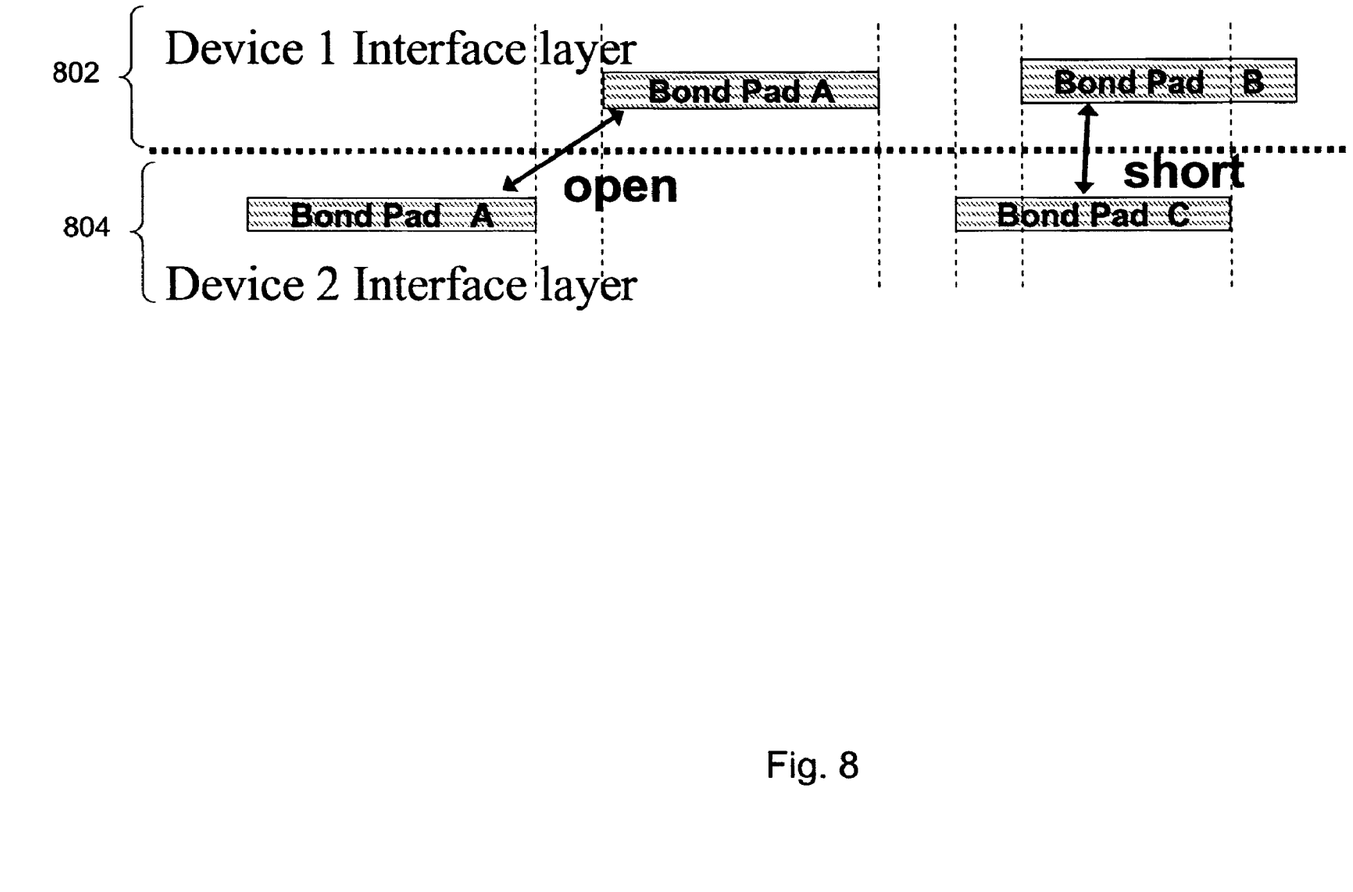
FIG. 8 is a cross-sectional view illustrating an embodiment of the alignment of interface layers of a 3D IC.

Referring now to FIG. 8, illustrated is a representation of an output of a verification scheme such as may be provided by the method 500, described above with reference to FIG. 5. FIG. 8 illustrates a cross-section of the alignment of interface layers of a first and second device of a 3D IC. A first device interface layer 802 including bond A and bond B is illustrated. A second device interface layer 804 including bond A and bond C is also illustrated. The cross-section depicts an open occurring where bond A of the interface layers are not properly aligned in the layout of the 3D IC. The cross-section also depicts a short occurring where bond B of the interface layer of the first die is coupled to bond C of the interface layer of second die (e.g., where bond B is to connect with bond B and bond C is to connect with bond C). This cross-section would be recognized by the LVS verification of method 500 (e.g., including pin text). Appropriate physical layout corrections may be then made prior to fabrication. The representative cross-section, and verification tools performed to generate it, may take into account alignment tolerances of the layers 802 and 804.

Figure 9:
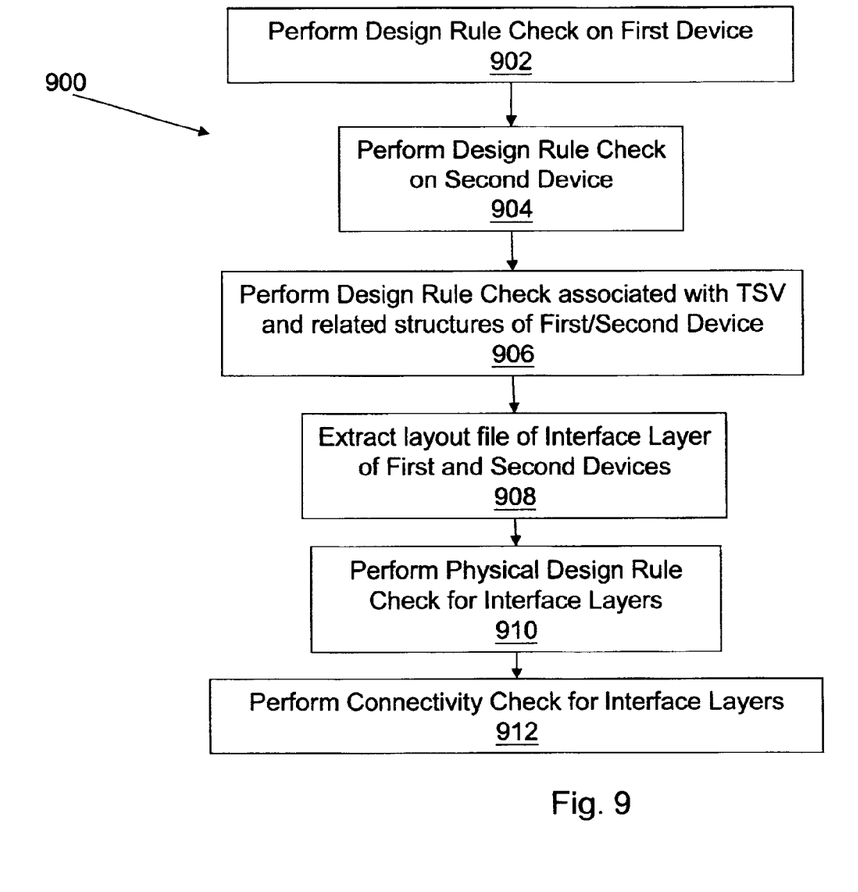
FIG. 9 is a flowchart illustrating an embodiment of a method of design verification of a 3D IC.

Referring now to FIG. 9, illustrated is a verification method 900 including a design rule check (DRC) verification. A DRC verification may ensure that the device layout follows specific design rules of a process (e.g., geometric constraints). The method 900 begins at step 902 where DRC is performed on the design of a first device of a 3D IC. The first device may be substantially similar to the die 110 or 220 described above with reference to FIG. 1. The method 900 then proceeds to step 904 where DRC is performed on the design of a second device of a 3D IC. The second device may be substantially similar to the die 110 or 122 described above with reference to FIG. 1. The method 900 then proceeds to step 906 where a DRC including rules associated with the through-silicon-via (TSV) and related structures is ran. For example, compliance with design rules specific to the TSV process may be verified for the first device.

The method 900 then proceeds to step 908 where the interface layer (or, in other words, the layout of the interface layer) of each of the first and second devices is extracted from the respective device layouts. In an embodiment, each interface layer is included in separate layouts. For example, a GDS II file for the interface layer of the first device may be generated and a second GDS II file for the interface layer of the second device may be generated. The method 900 then proceeds to step 910 where a DRC including physical rules associated with the interface layers and their connection to one another is performed on each interface layout. The DRC may include a verification of design rules such as those associated with bonding area width (e.g., width of pad 120b and/or 130b described above with reference to FIG. 1), spacing including interface layer interconnect routing to bonding area spacing and interface layer interconnect routing to routing spacing, density requirements, and/or other physical design constraints that may be applicable to the interface layer(s). In an embodiment, the spacing rules take into account alignment tolerances (e.g., the accuracy and repeatability of alignment of a top and bottom device in a 3D IC). In an embodiment, the spacing rules take into account different potentials that may be found on the device(s). The method 900 then proceeds to step 912 where a connectivity check is performed on the layout files. The connectivity check may determine an electrical open or short present in the connection of the interface layers. For example, see FIG. 8. In an embodiment, the connectivity verification takes into account alignment tolerances. In an embodiment, the connectivity verification takes into account different potentials that may be found on the device(s).

Figure 10:
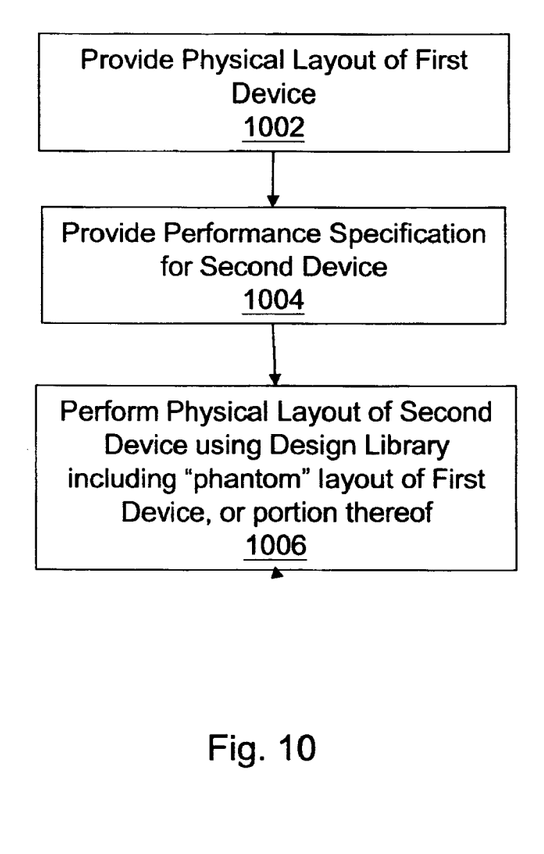
FIG. 10 is a flowchart illustrating an embodiment of a method of designing a physical layout of a device of a 3D IC.

Referring now to FIG. 10, a flow chart illustrating an embodiment of a method 1000 of designing a 3D IC is illustrated. The method begins at step 1002 where a physical layout of a first device to be included in a 3D IC is provided. The method then proceeds to step 1004 where a performance specification is provided for a second device that is to be included in the 3D IC. The performance specification may provide for performance requirements for a 3D IC (e.g., including the first device and the second device), and in particular those requirements for the second device. Automated software tools are used to transform the specification into a specific circuit structure (e.g., as provided in a "netlist").

Figure 11:
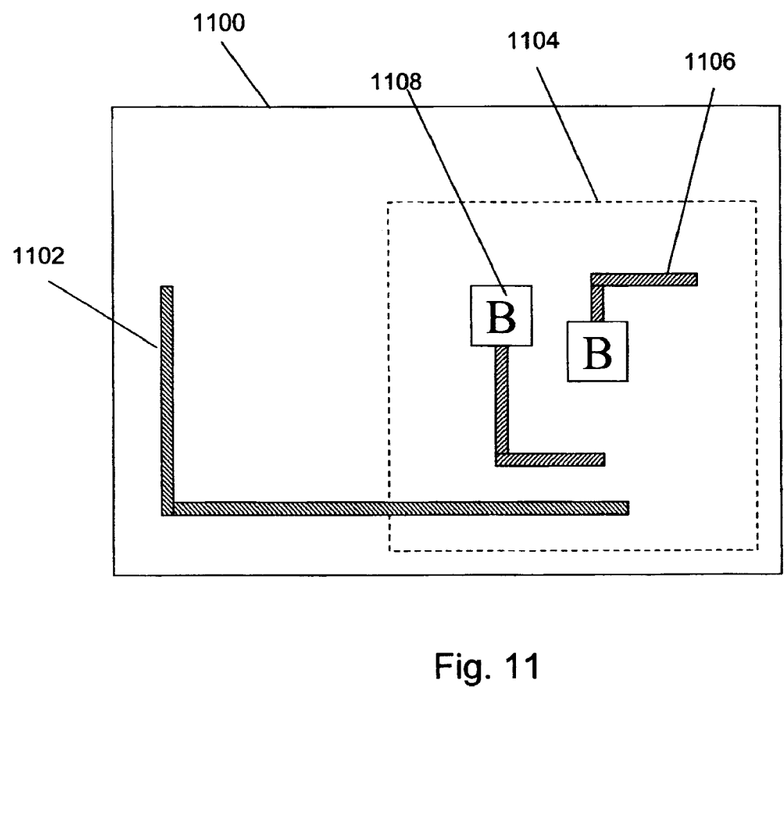
FIG. 11 is a top-view of an embodiment of a physical layout design of a device of a 3D IC used in an embodiment of the method of FIG. 10.

The method 1004 then proceeds to step 1006 where a physical layout is generated. Tools (CAD tools) are used to convert the netlist into a physical layout of the second device. In contrast to conventional methods however, the second device layout is performed taking into account the layout of the first device. The physical layout of the second device is generated by including the first device physical layout in the design library of the second device. In an embodiment, the first device layout may be imported into the library to used for library of the second device as a "phantom" view. The phantom view may include a footprint (e.g., the physical information of the circuit including the locations of the gates, interconnections, isolation regions, and the like) and information as to the connections (e.g., pin layouts) of the first device. The layout a specific layer of the first device may be imported into the library for designing the second device. For example, the layer imported may be the interface layer of the first device to which the second device will be physical coupled. FIG. 11 illustrates a layout of a second device 1100 including an interconnect structure 1102 of the second device. A phantom layout 1104 associated with a first device is provided in the layout 1100. The phantom layout 1104 includes interconnect structures 1106 and contact pads 1108. Layout of the second device 1100 may be performed such that contact is made to the pads 1108.

Figure 12:
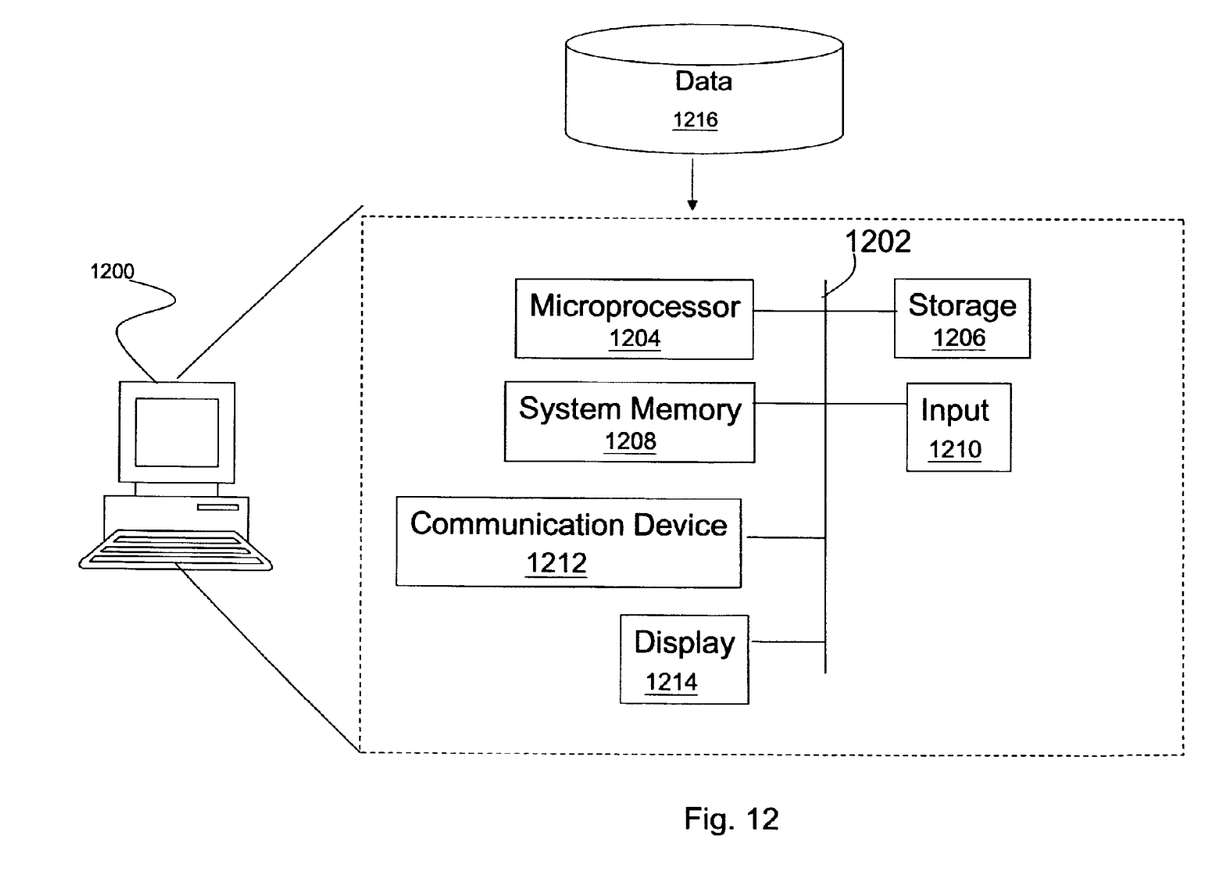
FIG. 12 is a block diagram illustrating an embodiment of a system used to implement the methods described herein.

Referring now to FIG. 12, illustrated is an embodiment of a computer system 1200 for implementing embodiments of the present disclosure including the systems and methods described herein. In an embodiment, the computer system 1200 includes functionality providing for design and verification of 3D IC such as described in the methods 200, 400, 500, 900, and 1000, described above with reference to FIGS. 2, 4, 5, 9, and 10 respectively.

The computer system 1200 includes a microprocessor 1204, an input device 1210, a storage device 1206, a system memory 1208, a display 1214, and a communication device 1212 all interconnected by one or more buses 1202. The storage device 1206 may be a floppy drive, hard drive, CD-ROM, optical device or any other storage device. In addition, the storage device 1206 may be capable of receiving a floppy disk, CD-ROM, DVD-ROM, or any other form of computer-readable medium that may contain computer-executable instructions. The communications device 1212 may be a modem, a network card, or any other device to enable the computer system to communicate with other nodes. It is understood that any computer system 1200 could represent a plurality of interconnected computer systems such as, personal computers, mainframes, PDAs, and telephonic devices.

The communications device 1212 may allow communications between the computer system 1200 and one or more tools/computer systems used in the design, layout, verification, fabrication, and/or testing of IC.

The computer system 1200 includes hardware capable of executing machine-readable instructions as well as the software for executing acts (typically machine-readable instructions) that produce a desired result. Software includes any machine code stored in any memory medium, such as RAM or ROM, and machine code stored on other storage devices (such as floppy disks, flash memory, or a CD ROM, for example). Software may include source or object code, for example. In additional software encompasses any set of instructions capable of being executed in a client machine or server. Any combination of hardware and software may comprise a computer system. The codes, executed by a computer, may include code for design, layout, and/or verification of devices (e.g., ICs). The system memory 1208 may be configured to store a net list, physical layout data including a GDS II file, a library of features to be used in a design of an IC, models, mathematical formula, design rules include rules associated with a technology node, TSV process, and/or other data provided in the design, layout, verification, fabrication, and/or testing of an IC.

Computer readable mediums include passive data storage, such as RAM as well as semi-permanent data storage such as a compact disk read only memory (CD-ROM). In an embodiment of the present disclosure may be embodied in the RAM of a computer to transform a standard computer into a new specific computing machine. Data structures are defined organizations of data that may enable an embodiment of the present disclosure. For example, a data structure may provide an organization of data, or an organization of executable code. Data signals could be carried across transmission mediums and store and transport various data structures, and thus, may be used to transport an embodiment of the present disclosure. The microprocessor 1204 may perform the mathematical functions necessary to perform LVS, DRC, layout, dummy feature insertion (such as by rule-based or model-based insertion), and/or other functions necessary for the design and/or verification of an integrated circuit.

A database 1216 may be any standard or proprietary database software known in the art. The physical location of the database 1216 is not limiting and may exist remotely from the server, be accessible by internet or intranet. The disclosure of the database 1216 includes embodiments that include a plurality of databases. The database 1216 may include manufacturing data, design data including netlists, technology files, physical layouts, design libraries, design rules, and/or other databases of information useful in the design, layout, verification, fabrication, and/or testing of an IC.

As described above, 3D IC, such as 3D IC 100 described above with reference to FIG. 1, provide numerous advantages. However, in current technology, there are significant drawbacks in the design and verification of 3D ICs. For example, designers are unable to check both GDS II interface layer rules correctly or to verify connectivity between two GDS II files. Furthermore the placement of dummy features in the interface layers provide for difficulties. For example, it is likely that placement of dummy features will cause a short between the two stacked die (GDS II files) because the layout of both interface layers are not considered when inserting dummy features for each interface layer individually.

Although only a few exemplary embodiments of this invention have been described in detail above, those skilled in the art will readily appreciate that many modifications are possible in the exemplary embodiments without material departing from the novel teachings and advantages of this disclosure.

Thus, provided is a method of designing an integrated circuit including providing a first layout associated with a first device and a second layout associated with a second device. The first device and the second device form a 3D integrated circuit (3D IC). A third layout is generated and includes a portion of the first layout and a portion of the second layout. In an embodiment, the portion of the first and second layouts includes an interface layer. A dummy feature is inserted into the third layout to generate a dummy feature layout. The dummy feature layout is merged into the first layout and into the second layout. The dummy feature layout may be reflected about its y-axis such that it is properly aligned, such as, when the first and second devices are stacked in a 3D IC.

Also provided is a method including providing a first layout corresponding to a first device of a 3D integrated circuit (3D IC) and a second layout of the 3D IC. The layouts each include an interface layer. A verification the interface layers is performed. The verification includes performing a design rule check (DRC) or a layout-versus-schematic (LVS) check. In an embodiment, the LVS check is performed on a single layout file including a side-be-side view of the first and second layouts. In an embodiment, the verification include's performing two LVS verifications, one on the first layout merged with the interface layer of the second layout, and one on the second layout merged with the interface layer of the first layout. In an embodiment, the verification is an DRC verification. The DRC verification may be performed on the first and second interface layers.

Further provided, a method of designing a 3D ICs including providing a first layout including an interface layer of a first die of a 3D IC and a second layout including an interface layer of a second die of the 3D IC. The first and second layouts, or portions thereof, are merged to form a single layout file. A verification on the single layout file. The verification includes at least one of a layout versus schematic (LVS) verification and design rule check (DRC) verification. Dummy features are placed using the single layout file.

What is claimed is:

1. A method, comprising:
providing a first layout corresponding to a first device of a 3D integrated circuit (3D IC), the first device having a first substrate, and wherein the first layout includes a first interface layer;
providing a second layout corresponding to a second device of the 3D IC, the second device having a second substrate, and wherein the second layout includes a second interface layer; and
using a computer to perform a verification of connectivity of the first and second interface layers, wherein the verification includes performing at least one of a design rule check (DRC) or a layout-versus-schematic (LVS).

2. The method of claim 1, further comprising:
performing a first layout-versus-schematic (LVS) verification on the first layout;
performing a second LVS verification on the second layout; and
wherein the verification of the connectivity of the first and second interface layers includes performing a third LVS verification on a third layout, wherein the third layout includes a side-by-side view of the first and second layout.

3. The method of claim 1, further comprising:
performing a layout-versus-schematic (LVS) verification on the first layout;
performing an LVS verification on the second layout;
generating a third layout including the first layout and the second interface layer of the second layout;
generating a fourth layout including the second layout and the first interface layer of the first layout; and
wherein the verification of the first and second interface layers includes performing an LVS verification on the third layout and an LVS verification on the fourth layout.

4. The method of claim 1, further comprising:
identifying at least one of an open and a short in the first interface layer and the second interface layer.

5. The method of claim 1, wherein the providing the second layout includes generating the second layout using a design library including a phantom layout corresponding to the first layout.

6. A method, comprising:
providing a first layout corresponding to a first device of a 3D integrated circuit (3D IC), the first device having a first substrate, and wherein the first layout includes a first interface layer;
providing a second layout corresponding to a second device of the 3D IC, the second device having a second substrate, and wherein the second layout includes a second interface layer; and
using a computer to perform a verification of connectivity of the first and second interface layers, wherein the verification includes:
performing a first design rule check (DRC) verification on the first layout;
performing a second DRC verification on the second layout;
performing a third DRC verification on the first layout, wherein the third DRC includes rules associated with a through-silicon-via (TSV) process;
extracting the first interface layer from the first layout;
extracting the second interface layer from the second layout;
and wherein the verification of the connectivity of the first and second interface layers includes performing a fourth DRC verification, wherein the fourth DRC includes rules associated with structures on the first and second interface layers, and wherein the fourth DRC is ran on the extracted first interface layer and the extracted second interface layer.

7. The method of claim 2, wherein the fourth DRC verification includes rules associated with an alignment tolerance of the first and second device.

8. The method of claim 2, wherein the fourth DRC verification includes performing a physical design rule verification on the extracted first and second interface layers and performing a connectivity check on the extracted first and second interface layers.

9. A method of designing a 3D integrated circuit (3D IC) having a first die having a first substrate and a second die having a second substrate, comprising:
providing a first layout, wherein the first layout includes an interface layer of the first die;
providing a second layout, wherein the second layout includes of an interface layer of the second die of the 3D IC;
merging at least a portion of each of the first and second layouts to form a single layout file;
performing a verification on the single layout file, wherein the verification includes at least one of a layout versus schematic (LVS) verification and design rule check (DRC) verification using a computer; and determining a placement of a dummy feature using the single layout file.

10. The method of claim 9, wherein the merging at least a portion of the first and second layouts includes providing a side-by-side view layout file.

11. The method of claim 9, wherein the single layout file includes the interface layer of the second die and a plurality of layers of the first die; and wherein the performing the verification on the single layout file is the LVS verification.

12. The method of claim 9, wherein the merging at least a portion of the first and second layouts to form the single layout file includes merging structures from two GDS II files, corresponding to the first and second layouts respectively, into a single GDS II file.

13. A method, comprising:
providing a first layout corresponding to a first device of a 3D integrated circuit (3D IC), wherein the first layout includes a first interface layer to be formed on a first substrate;
providing a second layout corresponding to a second device of the 3D IC, wherein the second layout includes a second interface layer to be formed on a second substrate, wherein the first and second interface layers are to be adjacent layers of the 3D IC;
performing a verification the first and second interface layers concurrently, wherein the verification includes using a computer to perform at least one of a design rule check (DRC) or a layout-versus-schematic (LVS); and
fabricating the 3D IC using the first and second layouts after performing the verification.

14. The method of claim 13, further comprising:
performing a first LVS check on the first layout prior to the performing the verification of connectivity; and
performing a second LVS check on the second layout prior to the performing the verification of connectivity.

15. The method of claim 13, wherein the performing the verification of the first and second interface layers includes performing a connectivity check to determine electrical open and shorts.

16. The method of claim 13, wherein the performing the verification of the first and second interface layers includes:
merging the layout of the first interface layer with the second device to form a first merged layout; and
performing the LVS check on the first merged layout.

17. The method of claim 16, wherein the performing the verification of the first and second interface layers includes:
merging the layout of the second interface layer with the first device to form a second merged layout; and
performing the LVS check on the second merged layout.

18. The method of claim 17, wherein the first device and the second device are each associated with a different technology node.

19. The method of claim 13, wherein the performing the verification of the first and second interface layers includes:
extracting the first interface layer from the first layout;
extracting the second interface layer from the second layout; and
performing the DRC on the extracted first and second interface layers.

20. The method of claim 13, wherein the performing the verification of the first and second interface layers includes:
determining the first device and the second device are associated with the same technology node; and
performing a side-by-side view of the first and second layouts.

* * * * *